United States Patent
Laaja et al.

(10) Patent No.: US 9,596,040 B2
(45) Date of Patent: Mar. 14, 2017

(54) LOCAL OSCILLATOR PHASE SYNCHRONIZATION FOR BEAMFORMING AND MIMO

(71) Applicant: Telefonaktiebolaget L M Ericsson (publ), Stockholm (SE)

(72) Inventors: Samu Laaja, Turku (FI); Jyri Sintonen, Salo (FI)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 14/626,019

(22) Filed: Feb. 19, 2015

(65) Prior Publication Data

US 2016/0248524 A1    Aug. 25, 2016

(51) Int. Cl.
  *H04B 7/02*   (2006.01)
  *H04B 17/12*  (2015.01)
  *H04B 7/04*   (2006.01)
  *H04B 17/10*  (2015.01)

(52) U.S. Cl.
  CPC ........... *H04B 17/12* (2015.01); *H04B 7/0413* (2013.01); *H04B 17/104* (2015.01)

(58) Field of Classification Search
  CPC ... H03L 2207/50; H03L 7/085; H03L 7/0991; H04B 17/104; H04B 7/0413
  USPC .............................. 375/371, 376, 267; 341/50
  See application file for complete search history.

(56) References Cited

U.S. PATENT DOCUMENTS

| | | | |
|---|---|---|---|
| 8,558,728 | B1 | 10/2013 | Lemkin et al. |
| 2007/0105587 | A1 | 5/2007 | Lu |
| 2007/0273419 | A1 | 11/2007 | Conway |
| 2008/0048791 | A1 | 2/2008 | Fahim |
| 2011/0304357 | A1* | 12/2011 | Tokairin ......... H03K 5/26 327/12 |
| 2012/0062286 | A1 | 3/2012 | Ginsburg et al. |
| 2013/0343490 | A1 | 12/2013 | Wertz et al. |
| 2014/0097986 | A1 | 4/2014 | Xue et al. |

(Continued)

FOREIGN PATENT DOCUMENTS

| | | |
|---|---|---|
| EP | 2657806 A2 | 10/2013 |
| WO | 02089252 A1 | 11/2002 |

OTHER PUBLICATIONS

Straayer, et al. "A Multi-Path Gated Ring Oscillator TDC With First-Order Noise Shaping," IEEE Journal of Solid-State Circuits, vol. 44, No. 4, Apr. 2009, pp. 1089-1098.

*Primary Examiner* — Leila Malek

(74) *Attorney, Agent, or Firm* — Coates & Bennett, PLLC

(57) ABSTRACT

An initial phase of each output signal generated by a plurality of radio frequency (RF) front-end circuits is determined by mixing an input signal with a mixing signal in a mixer of the corresponding RF front-end circuit. To that end, a time difference for each of the plurality of RF front-end circuits is determined by measuring a time difference between a reference signal (common to all of the RF front-end circuits) and the mixing signal of each RF front-end circuit. The initial phase for each output signal is then determined based on the measured time difference for the corresponding RF front-end circuit. Determining the initial phase in this manner accounts for any uncertainty of the phase when the RF front-end circuits are activated, enabling the phase of the corresponding antenna element to be accurately controlled.

18 Claims, 8 Drawing Sheets

(56) References Cited

U.S. PATENT DOCUMENTS

2014/0368242 A1* 12/2014 Unruh ...................... H03L 1/00
　　　　　　　　　　　　　　　　　　　　　327/156
2015/0103872 A1* 4/2015 Tarighat
　　　　　　　　　　　Mehrabani .............. H04L 27/00
　　　　　　　　　　　　　　　　　　　　　375/219

* cited by examiner

LOCAL OSCILLATOR PHASE SYNCHRONIZATION FOR BEAMFORMING AND MIMO

BACKGROUND

Beamforming systems in wireless networks, e.g., beamforming transmitters, beamforming receivers, etc., provide directional signal control by combining signals transmitted or received by two or more antenna elements of an antenna array such that signals at particular angles experience constructive interference, while other signals experience destructive interference. Such directional control provides improved coverage and less interference in the wireless network. For simplicity, the following refers to beamforming transmitters. It will be appreciated, however, that the problems and solutions discussed herein apply to any element utilizing beamforming or phase control, including beamforming receivers.

The directional control of beamforming transmitters may be achieved by controlling the phase and relative amplitude of the signal applied to each antenna element. Thus, the performance of the beamforming transmitter is inextricably tied to the accuracy of the phase control of each antenna element. Some systems implement local oscillator beamforming, which involves phase shifting the local oscillator (LO) signal for each antenna element to achieve the desired phase shift for the corresponding antenna element. Such phase control of the LO signal requires good control of the static phase differences between the separate transmitters.

The static phase differences between the transmitters, however, can be difficult to predict. For example, an integrated direct upconversion radio typically produces the upconversion mixing signal by dividing the LO signal with, e.g., a digital quadrature frequency divider. Such a divider may start up in any one of its possible internal states, where each state is associated with a different phase. This is a problem for beamforming transmitters, particularly in time-division duplex (TDD) systems, where each transmitter is powered down between transmission slots. Because each antenna element has its own transmitter, the resulting radiation pattern will constantly change between the transmission slots because the initial phase for each antenna element is unknown every time the transmitter is powered back on. This same problem also exists for TDD beamforming receivers, and transmitters and/or receivers in Multiple Input, Multiple Output (MIMO) systems. Thus, there remains a need for accounting for such start-up phase variations when controlling the phase of the antenna signals.

SUMMARY

The solution presented herein determines an initial phase of each output signal generated by a plurality of radio frequency (RF) front-end circuits by mixing an input signal with a mixing signal in a mixer of the corresponding RF front-end circuit. To that end, the solution presented herein measures a time difference for each of the plurality of RF front-end circuits by measuring a time difference between a reference signal (common to all of the RF front-end circuits) and each mixing signal. The initial phase for each output signal is then determined based on the measured time difference for the corresponding RF front-end circuit. In so doing, the solution presented herein accounts for any uncertainty of the phase when the RF front-end is activated, enabling the phase of the corresponding antenna element to be accurately controlled.

One exemplary embodiment provides a method of determining an initial phase of each output signal generated by a plurality of RF front-end circuits, each of said RF front-end circuits comprising a mixer configured to mix an input signal with a mixing signal to generate the output signal for that RF front-end circuit. The method comprises generating a reference signal common to the plurality of RF front-end circuits. For each of the plurality of RF front-end circuits, the method further comprises measuring a time difference between a start edge of the reference signal and a stop edge of the corresponding mixing signal. The start edge defines a beginning of a measurement period and each stop edge defines an end of the measurement period for the corresponding RF front-end circuit. The method further comprises determining the initial phase of each output signal from the time difference measured for the corresponding RF front-end circuit.

An exemplary wireless transceiver comprises a plurality of RF front-end circuits, a reference circuit, and a plurality of time measurement circuits, one for each RF front-end circuit. Each of the RF front-end circuits comprises a mixer configured to mix an input signal with a mixing signal to generate an output signal for that RF front-end circuit. The reference circuit is configured to generate a reference signal common to the plurality of RF front-end circuits. Each time measurement circuit is operatively connected to an input of the corresponding mixer and the reference circuit. Further, each time measurement circuit is configured to measure a time difference between a start edge of the reference signal and a stop edge of the mixing signal of the corresponding RF front-end circuit. The start edge defines a beginning of a measurement period, and each stop edge defines an end of the measurement period for the corresponding RF front-end circuit. The wireless transceiver is configured to determine the initial phase of each output signal from the time difference measured for the corresponding RF front-end circuit.

In another exemplary embodiment, a computer program product stored in a non-transitory computer readable medium controls a phase of each of a plurality of radio frequency (RF) front-end circuits of a wireless transceiver. The computer program product comprises software instructions which, when run on the wireless transceiver, causes the wireless transceiver to generate an output signal for each RF front-end circuit by mixing an input signal with a mixing signal, and generate a reference signal common to the plurality of RF front-end circuits. The software instructions further cause the wireless transceiver to measure a time difference between a start edge of the reference signal and a stop edge of the mixing signal of the corresponding RF front-end circuit. The start edge defines a beginning of a measurement period and wherein each stop edge defines an end of the measurement period for the corresponding RF front-end circuit. The software instructions further cause the wireless transceiver to determine an initial phase of each output signal from the time difference measured for the corresponding RF front-end circuit.

DETAILED DESCRIPTION

Figure 1:
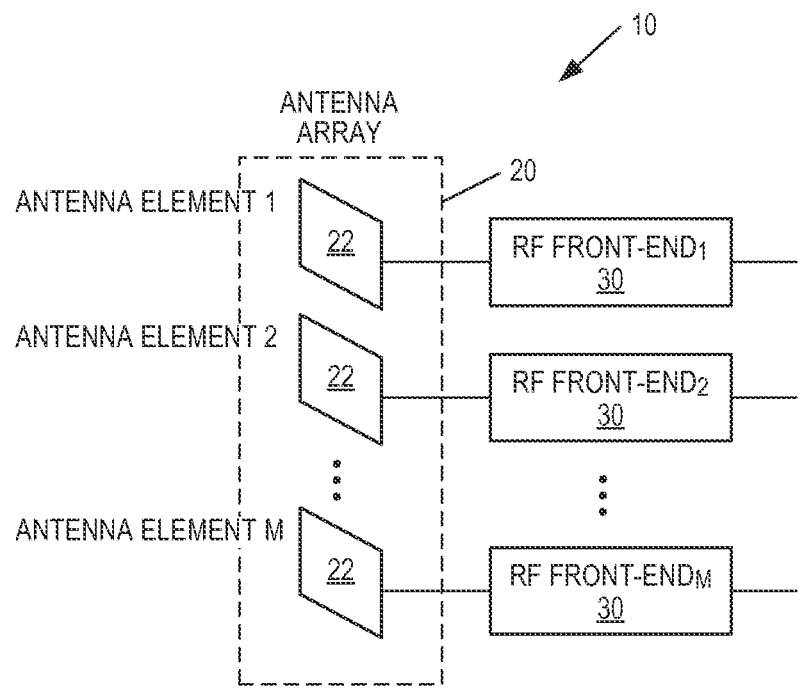
FIG. 1 shows an exemplary block diagram for beamforming system.
Figure 2:
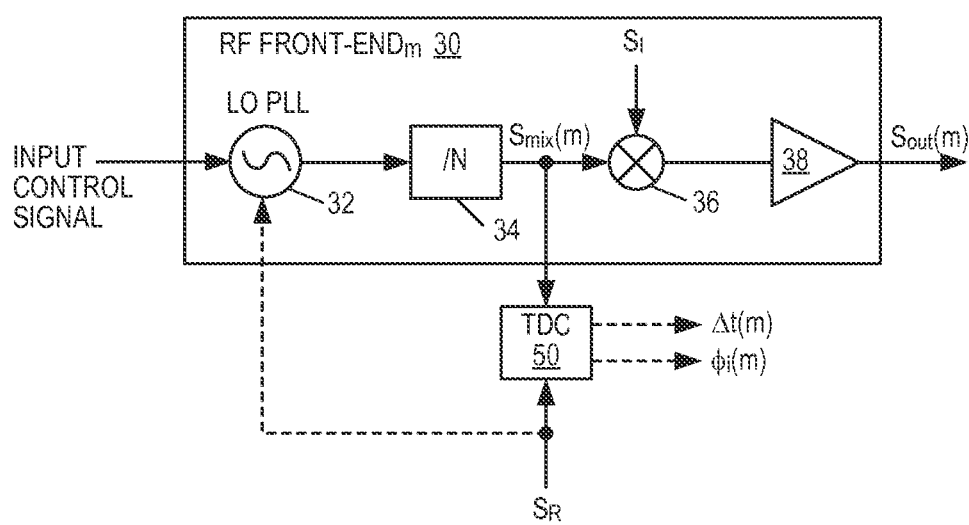
FIG. 2 shows a block diagram for a beamforming transmitter according to one exemplary embodiment.

FIG. 1 shows a beamforming system 10 comprising an antenna array 20 with M antenna elements 22, where the $m^{th}$ antenna element 22 is coupled to the $m^{th}$ radio frequency (RF) front end 30. Each RF front end 30 comprises a phase-locked loop (PLL) 32, as shown in FIG. 2. One way to control the direction of the beam for the antenna element 22 is to have the PLL 32 control the phase of the PLL output signal responsive to an input control signal input to the PLL 32 relative to the reference clock. In some embodiments, the PLL control signal indicates the desired phase shift of the PLL output signal, where the desired phase shift was determined by a controller (not shown) external to the PLL 32, e.g., an array controller, based on a location of the antenna element 22 in the antenna array 20, a desired beam direction, and/or a desired beam shape. In other embodiments, the PLL control signal indicates the location of the antenna element 22 in the antenna array 20, the desired beam direction, and/or the desired beam shape, and the PLL 32 determines or otherwise selects the desired phase shift based on the information provided by the PLL control signal. The phase of the transmitter, and thus the direction of the beam, may also or additionally be controlled by rotating the phase of the digital or analog baseband signal applied to the corresponding RF front-end 30. For example, the phase of the digital baseband signal may be rotated by a desired amount. After rotation, the digital baseband signal may be converted to an analog signal and applied to the corresponding RF front-end 30 for upconversion and transmission.

It will be appreciated that FIG. 1 shows a simplified block diagram of the exemplary beamforming system 10. Other components not pertinent to the discussion have been excluded from the drawings for simplicity.

Figure 3:
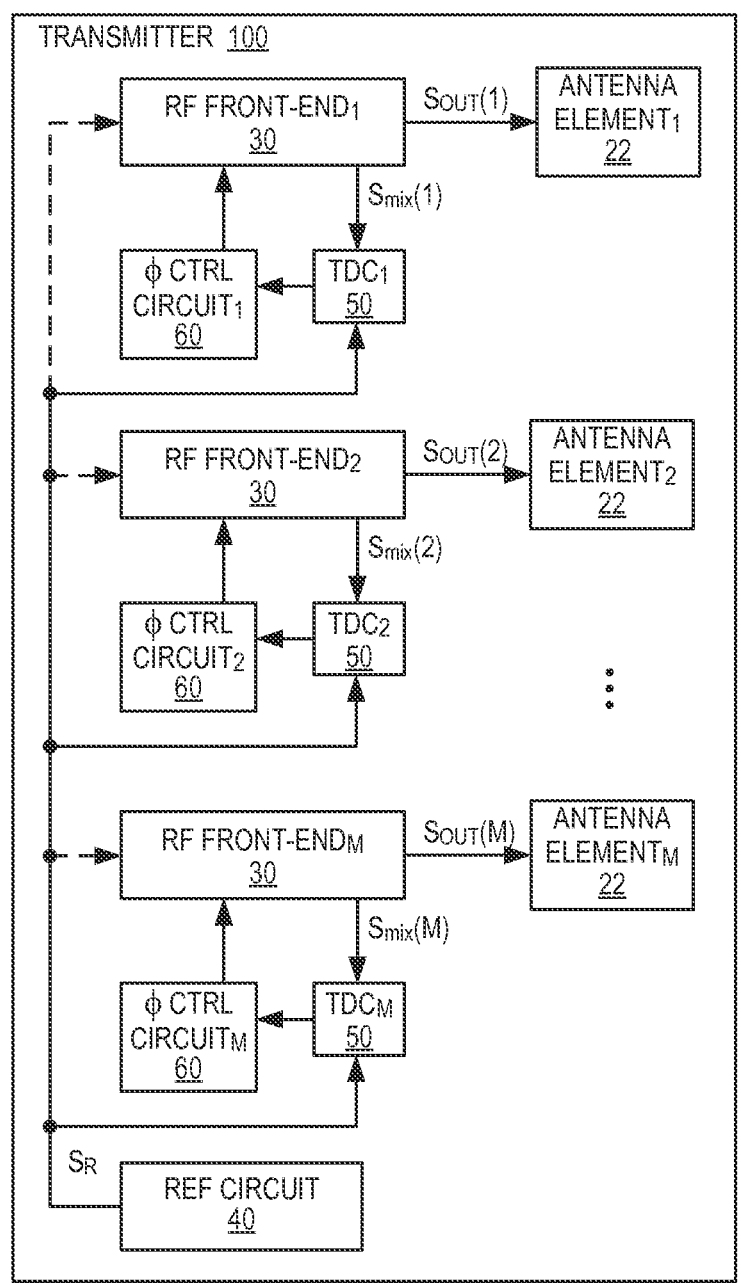
FIG. 3 shows an exemplary block diagram for a transmission RF front-end for the beamforming system of FIG. 1.

The following will first describe the embodiments disclosed herein in terms of a beamforming transmitter 100, such as shown in FIG. 3. It will be appreciated, however, that the embodiments disclosed herein apply to other beamforming elements, e.g., beamforming receivers (FIGS. 10 and 11), and/or any similar system requiring knowledge of an initial phase for phase control.

FIG. 2 shows a block diagram of an exemplary RF front-end 30, e.g., the $m^{th}$ RF front-end of the beamforming system 10 shown in FIG. 1. Each RF front-end 30 comprises a phase-locked loop (PLL) 32, a divider 34 operatively coupled to an output of the PLL 32, an upconversion mixer 36 operatively coupled to an output of the divider 34, and an amplifier 38 operatively coupled to an output of the mixer 36. PLL 32 outputs a signal at a desired PLL frequency $f_{LO}$ responsive to a reference signal. Divider 34 divides the frequency $f_{LO}$ of the PLL output signal by N to achieve a mixing signal $S_{mix}$ at a desired radio frequency, where N may be a fraction or an integer. Upconversion mixer 36 upconverts an input signal $S_I$ responsive to the frequency of the mixing signal $S_{mix}$. An amplifier 38, e.g., a power amplifier, amplifies the upconverted signal to generate the output signal $S_{out}(m)$, e.g., a transmission signal for transmission by the corresponding antenna element 22.

As shown in FIG. 3, transmitter 100 also includes a reference circuit 40 and plurality of time measurement circuits 50, e.g., a Time-to-Digital Converter (TDC), one for each RF front-end circuit 30. The reference circuit 40 is configured to generate a reference clock signal $S_R$ common to the plurality of RF front-end circuits 30. Reference circuit 40 may comprise any known clock circuit capable of generating a reference clock signal at the desired frequency. Further, while not required, the reference clock signal $S_R$ output by reference circuit 40 may also be used as the phase-locked loop reference signal provided to the phase-locked loop 32 in each RF front-end circuit 30.

Each TDC 50 is operatively connected to the reference clock circuit 40 to receive the common reference clock signal $S_R$, and to the corresponding RF front-end circuit 30 to receive the mixing signal $S_{mix}$ generated by that RF front-end circuit 30. Each TDC 50 measures a time difference related to the current phase of the corresponding mixing signal $S_{mix}$, and determines the initial phase for the output of the corresponding RF front-end circuit 30 based on the measured time difference. By using a common reference signal for all time difference measurements/initial phase determinations, the solution presented herein makes sure that the time difference measurements executed by each TDC 50 occur simultaneously, e.g., with the next edge of the reference clock signal. As a result, the correct initial phase can be determined for each output signal. The TDC 50 may output the time difference, or may compute the initial phase from the time difference, e.g., according to Equation (1), and output the computed initial phase.

Figure 4:
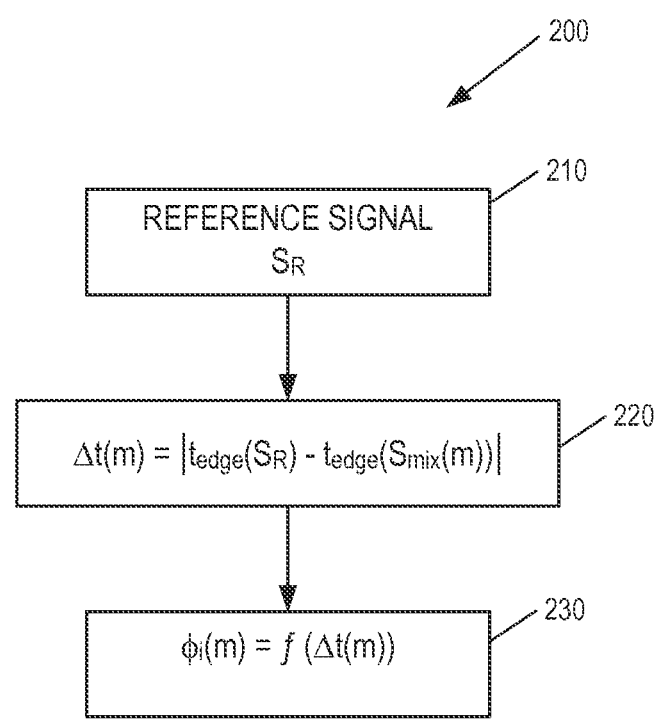
FIG. 4 shows a phase determination method according to one exemplary embodiment.

More particularly, FIG. 4 shows an exemplary method 200 for determining the initial phase of each output signal $S_{out}$ generated by each of the plurality of RF front-end circuits 30. After reference circuit 40 generates the reference signal $S_R$ (block 210), the TDC 50 measures the time difference $\Delta t(m)$ for the $m^{th}$ RF front-end circuit 30 by measuring a difference between a start edge $t_{edge}(S_R)$ of the reference clock signal $S_R$ and a stop edge $t_{edge}(S_{mix}(m))$ of the mixing signal $S_{mix}$ (block 220) for the $m^{th}$ RF front-end circuit 30. The transmitter 100 determines the initial phase of the output signal, in this case transmission signal $S_{out}(m)$, output by each RF front-end circuit 30 as a function of the corresponding measured time difference (block 230).

Figure 5:
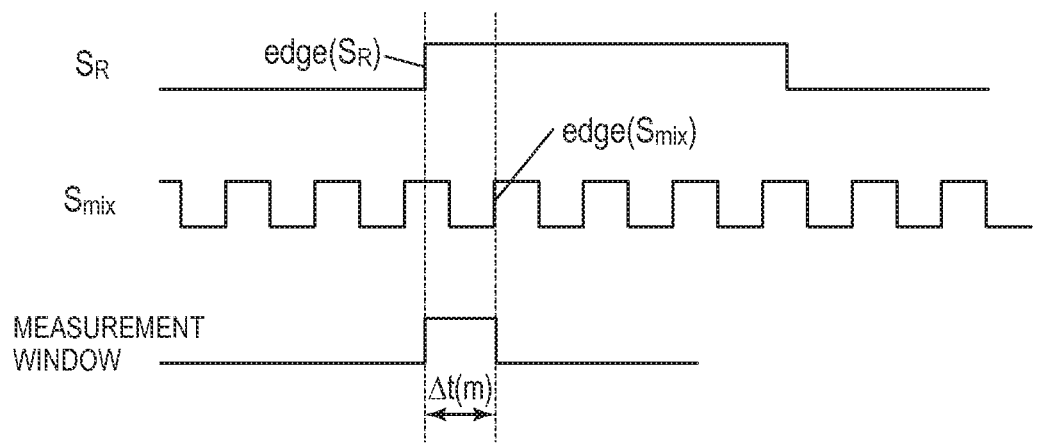
FIG. 5 shows an exemplary signaling diagram for determining the initial phase according to one exemplary embodiment.
Figure 6:
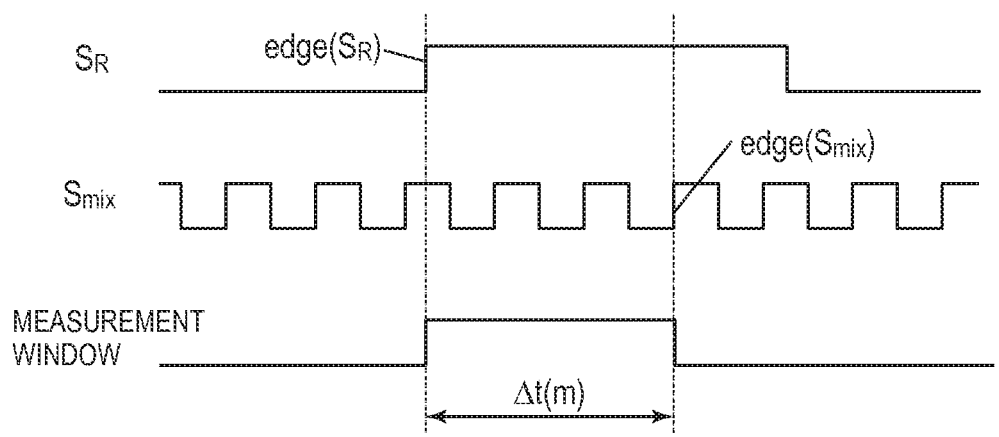
FIG. 6 shows an exemplary signaling diagram for determining the initial phase according to another exemplary embodiment.

FIGS. 5 and 6 show signaling diagrams illustrating the time measurement process of FIG. 4 according to various embodiments. The TDC 50 triggers on an edge of the reference clock signal $S_R$, e.g., a rising edge, and measures how long after that rising edge the mixing signal $S_{mix}$ has a rising edge. In FIG. 5, the TDC stops the measurement window at the next rising edge of the mixing signal $S_{mix}$ after detecting the rising edge of the reference clock signal $S_R$. In FIG. 6, the TDC 50 stops the measurement window at a rising edge of the mixing signal $S_{mix}$ several clock cycles after detecting the rising edge of the reference clock signal $S_R$. The measurement of the time difference over multiple LO clock cycles, such as shown in FIG. 6, may be used to avoid metastability in the triggering logic without adding complexity to the solution or impacting the accuracy of the measurement. In either case, the initial phase $\Delta\phi_i(m)$ for the $m^{th}$ output signal $S_T(m)$ may be calculated according to:

$$\Delta\phi_i(m) = 2\pi \frac{\Delta t(m)}{f_{LO}(m)} = 2\pi \frac{n_{TDC}(m)\Delta\text{step}}{f_{LO}(m)} \quad (1)$$

where $n_{TDC}(m)$ represents the number of TDC quantization steps measured by the $m^{th}$ TDC 50 between the start edge (e.g., the reference clock rising edge $t_{edge}(S_R)$) and the stop edge (e.g., the mixing signal rising edge $t_{edge}(S_{mix})$), and $\Delta$step represents TDC quantization step size in seconds. It will be appreciated that the embodiments disclosed herein do not require the TDC 50 to use the rising edges of the mixing and reference clock signals; any signaling edge, e.g., a falling edge, may alternatively be used.

Figure 7A:
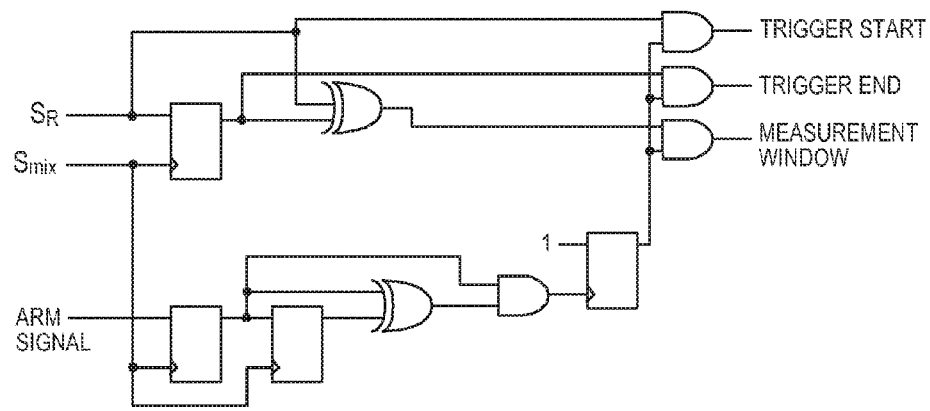
FIG. 7A shows one exemplary circuit implementation for the TDC.
Figure 7B:
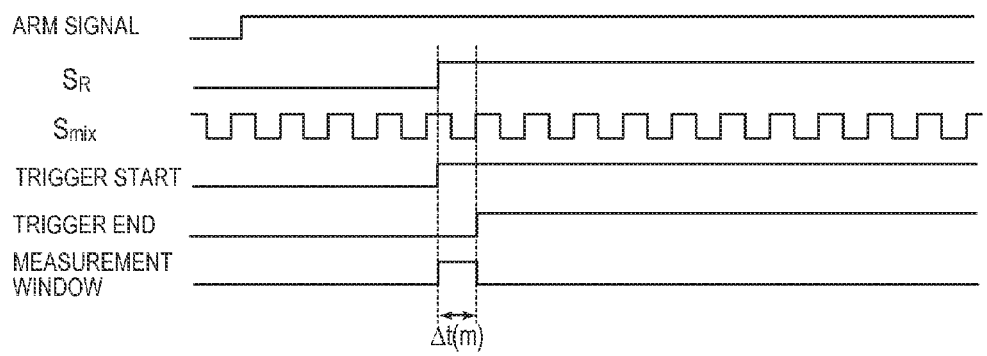
FIG. 7B shows an exemplary signaling diagram for the TDC of FIG. 7A.

FIG. 7A shows one exemplary circuit/logic implementation for the TDC 50, while FIG. 7B shows one exemplary signaling diagram corresponding to the TDC 50 of FIG. 7A. As noted herein, the arm signal is not required for all embodiments. The configuration of AND, XOR, and timing gates shown in FIG. 7A perform the corresponding logic functions on the input signals ($S_R$, $S_{mix}$, and optionally, the arm signal) to trigger the beginning and end of the measurement window, and thus to enable the measurement of the duration of the measurement window. Because each TDC 50 has the same input reference clock signal $S_R$, and the same arm signal (when used), the determination of the duration of the measurement window enables the initial phase to be simultaneously determined for each output signal.

The transmitter 100 uses the determined initial phase $\Delta\phi_i(m)$ to facilitate accurate phase control of the corresponding antenna element 22. To that end, the transmitter 100 may also include a phase control circuit 60 for each RF front-end circuit 30, as shown in FIG. 3. The phase control circuit 60 may receive the determined initial phase $\Delta\phi_i(m)$ from the corresponding TDC 50. Alternatively, the phase control circuit 60 may receive the measured time difference $\Delta t(m)$ from the corresponding TDC 50, and then compute the initial phase $\Delta\phi_i(m)$ from the received measured time difference. In any event, the phase control circuit 60 uses the initial phase $\Delta\phi_i(m)$ to initialize or "calibrate" the phase of the corresponding $m^{th}$ RF front-end circuit 30 so that the $m^{th}$ RF front-end circuit 30 executes any phase control activities from a known initial phase. The phase control circuits 60 may then adjust, e.g., rotate, the initial phase determined for that output signal to achieve the desired phase value for that output signal. For example, the phase control circuit 60 may use the initial phase to adjust the input control signal used to control the phase of the PLL output signal. Alternatively, the phase control circuit 60 may use the initial phase to control/adjust the phase of the baseband signal $S_I$. Because the phase control circuit 60 effectively starts the phase adjustment from the known initial phase value, the resulting phase control is accurate and reliably achieves the desired performance, e.g., beamforming.

Figure 8:
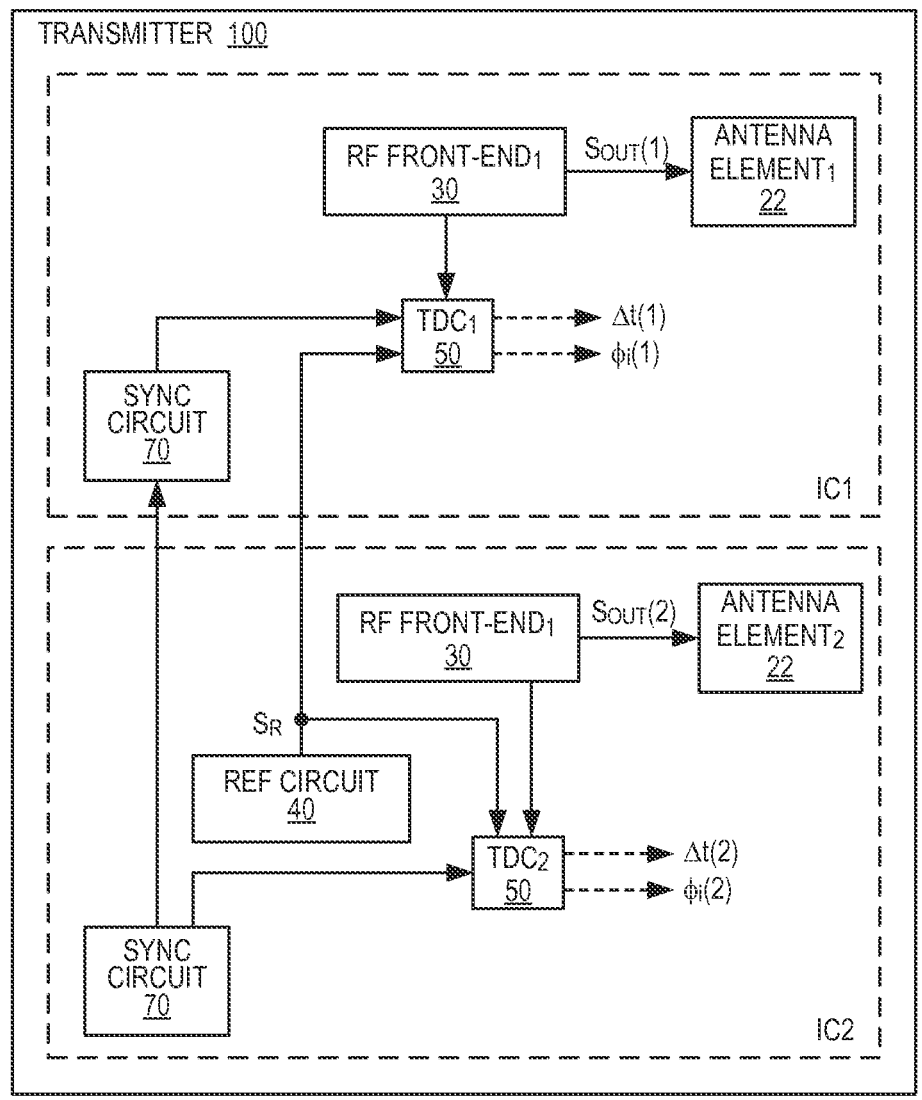
FIG. 8 shows a block diagram for a beamforming transmitter according to another exemplary embodiment.
Figure 9:
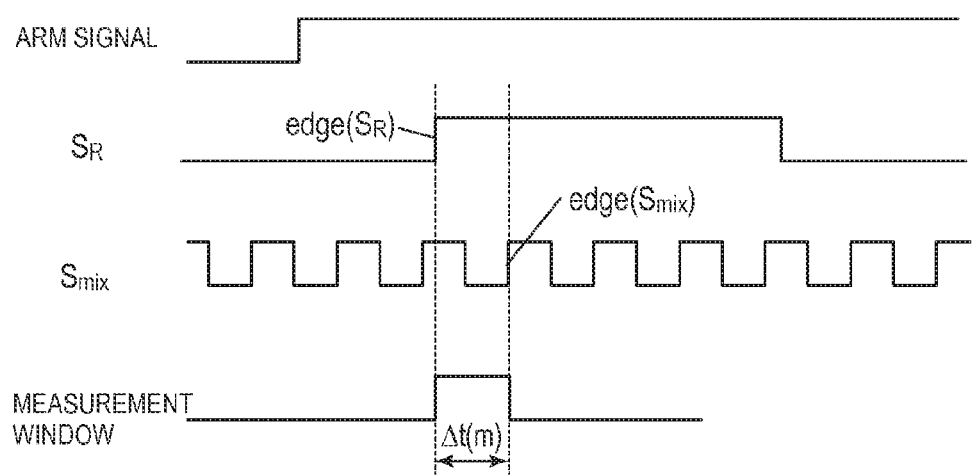
FIG. 9 shows an exemplary signaling diagram for determining the initial phase according to another exemplary embodiment.

FIG. 3 involves a transmitter with all of the RF front-end circuits 30 on a single integrated circuit. The solution presented herein, however, may also be used when different RF front-end circuits 30 are disposed on different integrated circuits, such as shown in FIG. 8. In such cases, transmitter 100 will further include a synchronization circuit 70 for each integrated circuit. Each synchronization circuit 70 may be implemented, e.g., using a counter running with a clock common to all of the integrated circuits. The synchronization circuits 70 synchronize the timing measurements occurring on different integrated circuits. To synchronize the timing measurements, each synchronization circuit 70 provides an arm signal, such as shown in FIG. 9, to the TDCs 50 on that integrated circuit. Further, the synchronization circuits 70 are also synchronized across the integrated circuits to makes sure that the arm signals provided to each TDC 50 in the transmitter 100 are synchronized. As shown in FIG. 9, once the arm signal is activated, e.g., goes high, the TDC 50 triggers on an edge of the reference clock signal $S_R$, e.g., a rising edge, and measures how long after that rising edge the mixing signal $S_{mix}$ has a rising edge to determine $\Delta t(m)$. The initial phase $\Delta\phi_i(m)$ for the $m^{th}$ output signal $S_{out}(m)$ may be calculated according to Equation (1). While the above-described examples only use the synchronization circuit 70 and corresponding "arm" signals when different circuits of the transmitter 100 are disposed on different integrated circuits, the use of the synchronization circuit 70 is not so limited. It will be appreciated that the transmitter 100 may use synchronization circuit(s) 70 and the corresponding arm signal(s) for any transmitter configuration, including when all of the RF front-end circuits 30 are disposed on a single integrated circuit.

As noted above, the solution presented herein also applies to beamforming receivers. In this case, the phase control circuit controls how the received signals are combined to achieve the desired beamforming benefits.

Figure 10:
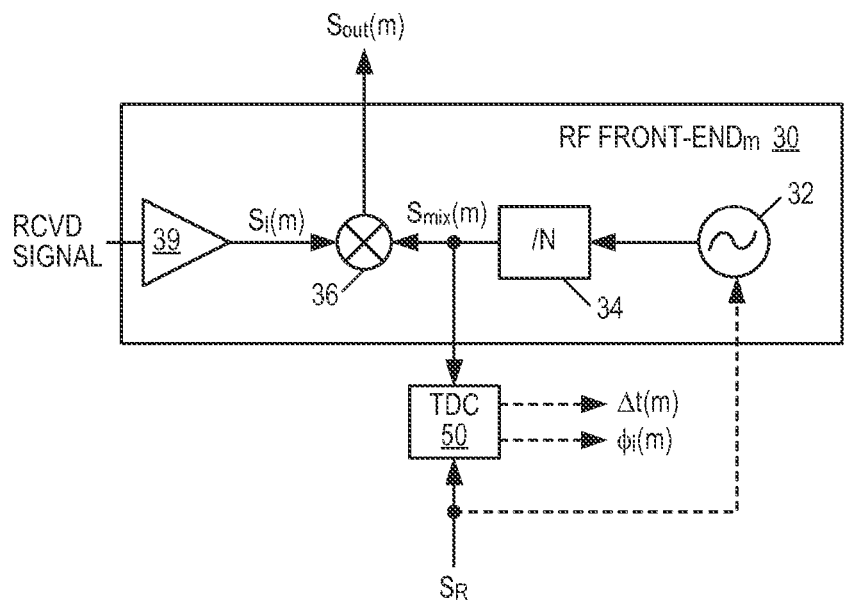
FIG. 10 shows an exemplary block diagram for a reception RF front-end for the beamforming system of FIG. 1.

FIG. 10 shows a block diagram of the $m^{th}$ antenna element 22, $m^{th}$ receiving RF front-end 30, and the corresponding $m^{th}$ TDC 50. In this case, the antenna element 22 provides a received signal to an amplifier 39, which generates an amplified input signal $S_I$ for the mixer 36 of that RF front-end circuit 30. Like with the transmitter embodiment, a reference circuit 40 (FIG. 11) generates a reference clock signal $S_R$ common to the plurality of RF front-end circuits 30. Further, while not required, the reference clock signal $S_R$ output by reference circuit 40 may also be used as the phase-locked loop reference signal provided to the phase-locked loop 32 in each RF front-end circuit 30.

Each TDC 50 is operatively connected to the reference clock circuit 40 to receive the common reference clock signal $S_R$, and to the corresponding RF front-end circuit 30 to receive the mixing signal $S_{mix}$ generated by that RF front-end circuit 30. Each TDC 50 measures a time difference related to the current phase of the corresponding mixing signal $S_{mix}$, and determines the initial phase for the output of the corresponding RF front-end circuit 30 based on the measured time difference. For reception beamforming, this involves the TDC 50 measuring the time difference $\Delta t(m)$ for the $m^{th}$ RF front-end circuit 30 by measuring a difference between a start edge $t_{edge}(S_R)$ of the reference clock signal $S_R$ and a stop edge $t_{edge}(S_{mix}(m))$ of the mixing signal $S_{mix}$ for the $m^{th}$ RF front-end circuit 30. The transmitter 100 determines the initial phase of the output signal, in this case reception output signal $S_{out}(m)$ output by each RF front-end circuit 30, as a function of the corresponding measured time difference.

Figure 11:
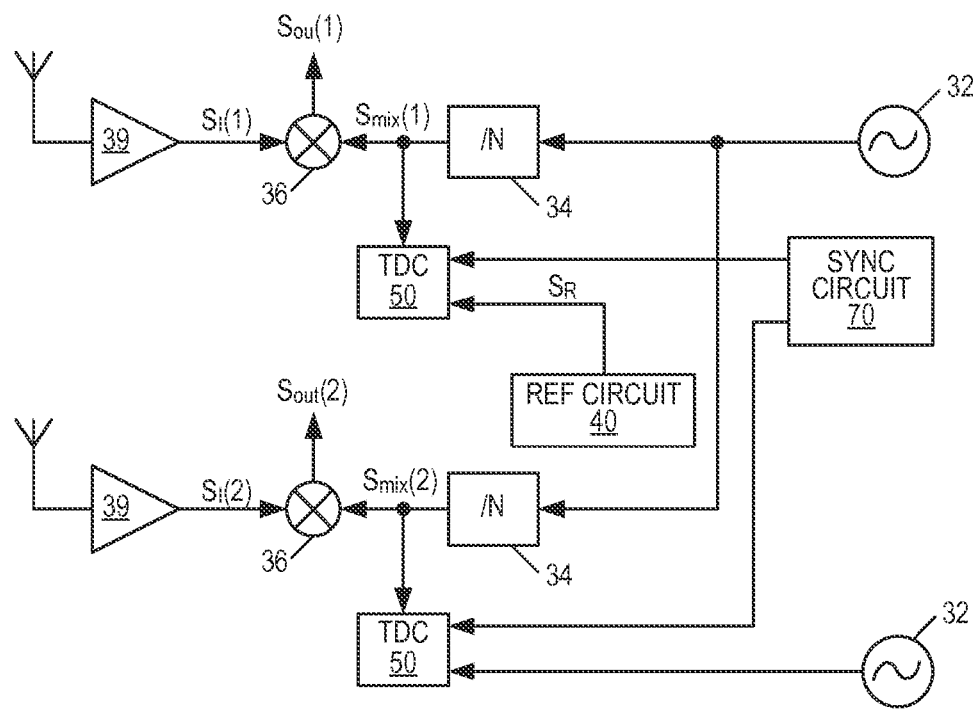
FIG. 11 shows a block diagram for a beamforming receiver according to one exemplary embodiment.

FIG. 11 shows another block diagram of a beamforming receiver that includes synchronization circuit 70. Synchronization circuit 70 provides an arm signal to the corresponding TDCs 50. Further, if there are multiple synchronization circuits 70, each of the synchronization circuits are also synchronized across the integrated circuits to makes sure that the arm signals provided to each TDC 50 in the transmitter 100 are synchronized. Once the arm signal is activated, e.g., goes high, the TDC 50 triggers on an edge of the reference clock signal $S_R$, e.g., a rising edge, and measures how long after that rising edge the mixing signal $S_{mix}$ has a rising edge to determine $\Delta t(m)$. The initial phase $\Delta\phi_i(m)$ for the $m^{th}$ output signal $S_T(m)$ may be calculated according to Equation (1).

The solution presented herein provides an efficient and cost-effective way to determine the initial phase for scenarios where the phase caused by RF circuit components, e.g., a frequency divider, changes periodically, e.g., each time the circuit is powered on. By simultaneously determining the initial phase of the output signal of multiple RF circuits, the solution presented herein enables accurate phase control.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of determining an initial phase of each output signal generated by a plurality of radio frequency (RF) front-end circuits of a beamforming or multiple input, multiple output (MIMO) system, each of said RF front-end circuits comprising a mixer tuned to a common frequency and configured to mix an input signal with a mixing signal to generate the output signal for that RF front-end circuit, the method comprising:
   generating a reference signal common to the plurality of RF front-end circuits;
   for each of the plurality of RF front-end circuits, measuring a time difference between a start edge of the reference signal and a stop edge of the corresponding mixing signal, wherein the start edge defines a beginning of a measurement period and wherein each stop edge defines an end of the measurement period for the corresponding RF front-end circuit;
   determining the initial phase of each output signal from the time difference measured for the corresponding RF front-end circuit; and
   using the initial phase to set a final phase of the corresponding output signal to a desired value;
   wherein each of the plurality of RF front-end circuits comprises:
      transmission RF front-end circuits, where each output signal comprises a transmission signal applied to an antenna element of an antenna array; or
      reception front-end circuits, where each input signal comprises a reception signal provided by an antenna element of an antenna array.

2. The method of claim 1 wherein using the initial phase to set the final phase of the corresponding output signal to the desired value comprises rotating the initial phase of the output signal to set the final phase of that output signal to the desired value.

3. The method of claim 1 further comprising deriving the mixing signal from a local oscillator signal and a frequency divider.

4. The method of claim 3 wherein the reference signal comprises a phase-locked loop reference signal applied to a phase-locked loop in each RF front-end circuit, and wherein the phase-locked loop generates the local oscillator signal based on the reference signal.

5. The method of claim 1 wherein the start and stop edges both comprise rising edges, and wherein the stop edge comprises the next rising edge of the corresponding mixing signal occurring immediately after the start edge.

6. The method of claim 1 wherein the measurement period spans multiple periods of the mixing signal.

7. The method of claim 1 further comprising arming the RF front-end circuits to synchronize the measuring of the time differences for each of the plurality of RF front-end circuits.

8. A wireless circuit of a beamforming or multiple input, multiple output (MIMO) system, the wireless circuit comprising:
   a plurality of radio frequency (RF) front-end circuits of the beamforming or the multiple input, multiple output (MIMO) system, each of said RF front-end circuits comprising a mixer tuned to a common frequency and configured to mix an input signal with a mixing signal to generate an output signal for that RF front-end circuit;
   a reference circuit configured to generate a reference signal common to the plurality of RF front-end circuits; and
   a plurality of time measurement circuits, one for each RF front-end circuit, each time measurement circuit operatively connected to an input of the corresponding mixer and the reference circuit and configured to measure a time difference between a start edge of the reference signal and a stop edge of the mixing signal of the corresponding RF front-end circuit, wherein the start edge defines a beginning of a measurement period and wherein each stop edge defines an end of the measurement period for the corresponding RF front-end circuit;
   wherein the wireless circuit is configured to determine the initial phase of each output signal from the time difference measured for the corresponding RF front-end circuit, and to use the initial phase to set a final phase of the corresponding output signal to a desired value;
   wherein each of the plurality of RF front-end circuits comprises:
      transmission RF front-end circuits, where each output signal comprises a transmission signal applied to an antenna element of an antenna array; or
      reception front-end circuits, where each input signal comprises a reception signal provided by an antenna element of an antenna array.

9. The wireless circuit of claim 8 further comprising a phase control circuit configured to use the initial phase to set the final phase of the corresponding output signal to the desired value by rotating the initial phase of the output signal to set the final phase of that output signal to the desired value.

10. The wireless circuit of claim 8 wherein each RF front-end circuit further comprises:
   a local oscillator implemented as a phase-locked loop; and
   a frequency divider operatively coupled to an output of the phase-locked loop;
   wherein the mixing signal is derived from an output of the frequency divider.

11. The wireless circuit of claim 10 wherein the reference signal further comprises a phase-locked loop reference signal applied to the phase-locked loop.

12. The wireless circuit of claim 8 wherein the start and stop edges both comprise rising edges, and wherein the stop edge comprises the next rising edge of the corresponding mixing signal occurring immediately after the start edge.

13. The wireless circuit of claim 8 wherein the measurement period spans multiple periods of the mixing signal.

14. The wireless circuit of claim 8 further comprising at least one synchronization circuit configured to synchronize the operations of the time measurement circuits to synchronize the measuring of the time differences for each of the plurality of RF front-end circuits by applying a common arming signal to each of the time measurement circuits.

15. The wireless circuit of claim 8 wherein each time measurement circuit determines the initial phase of the corresponding output signal based on the time difference measured for the corresponding RF front-end circuit.

16. The wireless circuit of claim 8 further comprising a plurality of phase control circuits, one for each RF front-end circuit, each phase control circuit configured to determine the initial phase of the corresponding output signal based on the time difference measured for the corresponding RF front-end circuit.

17. A computer program product stored in a non-transitory computer readable medium for controlling a phase of each of a plurality of radio frequency (RF) front-end circuits of a wireless circuit of a beamforming or multiple input, multiple output (MIMO) system, the computer program product comprising software instructions which, when run on the wireless circuit, causes the wireless circuit to:
  generate an output signal for each RF front-end circuit by mixing an input signal with a mixing signal tuned to a common frequency; and
  generate a reference signal common to the plurality of RF front-end circuits;
  measure a time difference between a start edge of the reference signal and a stop edge of the mixing signal of the corresponding RF front-end circuit, wherein the start edge defines a beginning of a measurement period and wherein each stop edge defines an end of the measurement period for the corresponding RF front-end circuit;
  determine an initial phase of each output signal from the time difference measured for the corresponding RF front-end circuit; and
  use the initial phase to set a final phase of the corresponding output signal to a desired value;
  wherein each of the plurality of RF front-end circuits comprises:
    transmission RF front-end circuits, where each output signal comprises a transmission signal applied to an antenna element of an antenna array; or
    reception front-end circuits, where each input signal comprises a reception signal provided by an antenna element of an antenna array.

18. A wireless transceiver of a beamforming or multiple input, multiple output (MIMO) system comprising:
  a plurality of radio frequency (RF) front-end circuits of the beamforming or the multiple input, multiple output (MIMO) system, each of said RF front-end circuits comprising a mixer tuned to a common frequency and configured to mix an input signal with a mixing signal to generate an output signal for that RF front-end circuit;
  a reference circuit configured to generate a reference signal common to the plurality of RF front-end circuits; and
  a plurality of time measurement circuits, one for each RF front-end circuit, each time measurement circuit operatively connected to an input of the corresponding mixer and the reference circuit and configured to measure a time difference between a start edge of the reference signal and a stop edge of the mixing signal of the corresponding RF front-end circuit, wherein the start edge defines a beginning of a measurement period and wherein each stop edge defines an end of the measurement period for the corresponding RF front-end circuit;
  wherein the wireless transceiver is configured to determine the initial phase of each output signal from the time difference measured for the corresponding RF front-end circuit, and to use the initial phase to set a final phase of the corresponding output signal to a desired value;
  wherein each of the plurality of RF front-end circuits comprises:
    transmission RF front-end circuits, where each output signal comprises a transmission signal applied to an antenna element of an antenna array; or
    reception front-end circuits, where each input signal comprises a reception signal provided by an antenna element of an antenna array.

* * * * *

UNITED STATES PATENT AND TRADEMARK OFFICE
CERTIFICATE OF CORRECTION

PATENT NO. : 9,596,040 B2
APPLICATION NO. : 14/626019
DATED : March 14, 2017
INVENTOR(S) : Laaja et al.

Page 1 of 1

It is certified that error appears in the above-identified patent and that said Letters Patent is hereby corrected as shown below:

On the Title Page

In Item (74), under "Attorney, Agent, or Firm", in Column 2, Line 1, delete "Coates" and insert -- Coats --, therefor.

In the Drawings

In Fig. 8, Sheet 6 of 8, delete " 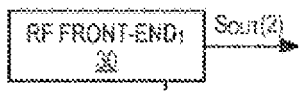 " and insert -- 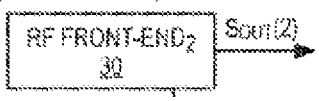 --, therefor.

In Fig. 11, Sheet 8 of 8, delete "$S_{ou}(1)$" and insert -- $S_{out}(1)$ --, therefor.

In the Specification

In Column 2, Line 60, delete "for" and insert -- for a --, therefor.

In Column 5, Line 4, delete "$S_T(m)$" and insert -- $S_{out}(m)$ --, therefor.

In Column 7, Line 4, delete "$S_T(m)$" and insert -- $S_{out}(m)$ --, therefor.

In the Claims

In Column 9, Line 26, in Claim 17, delete "frequency; and" and insert -- frequency; --, therefor.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*